United States Patent
Hsueh et al.

(10) Patent No.: US 9,472,826 B2
(45) Date of Patent: Oct. 18, 2016

(54) THIN FILM BATTERY STRUCTURE AND MANUFACTURING METHOD THEREOF

(71) Applicant: Institute of Nuclear Energy Research Atomic Energy Council, Executive Yuan, Taoyuan County (TW)

(72) Inventors: Tien-Hsiang Hsueh, Taoyuan County (TW); Chi-Hung Su, Taoyuan County (TW); Der-Jun Jan, Taoyuan County (TW); Yuh-Jenq Yu, Taoyuan county (TW); Yuan-Ruei Jheng, Taoyuan County (TW)

(73) Assignee: INSTITUTE OF NUCLEAR ENERGY RESEARCH ATOMIC ENERGY COUNCIL, EXECUTIVE YUAN, Longtan Township, Taoyuan County (TW)

(*) Notice: Subject to any disclaimer, the term of this patent is extended or adjusted under 35 U.S.C. 154(b) by 50 days.

(21) Appl. No.: 14/505,249

(22) Filed: Oct. 2, 2014

(65) Prior Publication Data

US 2016/0020484 A1 Jan. 21, 2016

(30) Foreign Application Priority Data

Jul. 18, 2014 (TW) .............................. 103124744 A (51) Int. Cl.
*H01M 10/04* (2006.01)
*H01M 4/04* (2006.01)
(Continued)

(52) U.S. Cl.
CPC .......... *H01M 10/0436* (2013.01); *C23C 14/34* (2013.01); *C23C 14/35* (2013.01); *C23C 16/44* (2013.01); *H01M 4/049* (2013.01); *H01M 4/0419* (2013.01); *H01M 4/0421* (2013.01); *H01M 4/70* (2013.01); *H01M 4/78* (2013.01);
(Continued)

(58) Field of Classification Search
CPC ......... H01M 10/0436; H01M 4/0419; H01M 4/0421; H01M 4/049; H01M 4/70; H01M 4/78; H01M 10/052; H01M 10/0562; H01M 10/0585; H01M 6/40; C23C 14/34; C23C 14/35; C23C 16/44; Y02E 60/122
See application file for complete search history.

(56) References Cited

U.S. PATENT DOCUMENTS 5,350,645 A * 9/1994 Lake ...................... H01M 4/04
29/623.3
7,540,886 B2 6/2009 Zhang et al.
(Continued)

FOREIGN PATENT DOCUMENTS

EP 1928051 A1 6/2008
JP 2008192594 A * 8/2008
(Continued)

*Primary Examiner* — Gregg Cantelmo
(74) *Attorney, Agent, or Firm* — Muncy, Geissler, Olds & Lowe, P.C.

(57) ABSTRACT

A thin film battery structure includes a substrate, a first current collector layer, a first electrode layer array, an electrolyte layer, a second electrode layer, and a second current collector layer. The first current collector layer is disposed on the substrate and has at least one first current collector bump. The first electrode layer array has at least one first electrode layer, where each first electrode layer is disposed on the first current collector layer, and at least one first current collector bump is embedded inside each first electrode layer. Each first electrode layer is embedded inside the electrolyte layer. The second electrode layer is disposed on the electrolyte layer. The second current collector layer is disposed on the second electrode layer.

19 Claims, 5 Drawing Sheets

(51) Int. Cl.
*H01M 10/052* (2010.01)
*H01M 10/0562* (2010.01)
*H01M 10/0585* (2010.01)
*H01M 6/40* (2006.01)
*C23C 14/34* (2006.01)
*C23C 16/44* (2006.01)
*H01M 4/70* (2006.01)
*H01M 4/78* (2006.01)
*C23C 14/35* (2006.01)

(52) U.S. Cl.
CPC ....... *H01M 10/052* (2013.01); *H01M 10/0562* (2013.01); *H01M 10/0585* (2013.01); *H01M 6/40* (2013.01); *Y02E 60/122* (2013.01)

(56) References Cited

U.S. PATENT DOCUMENTS

2009/0202908 A1* 8/2009 Sumihara ................ H01M 4/13
429/218.1
2010/0227228 A1* 9/2010 Yamazaki .............. H01G 11/28
429/331

FOREIGN PATENT DOCUMENTS

JP 2013080669 A 5/2013
TW 200919802 A 5/2009

* cited by examiner

THIN FILM BATTERY STRUCTURE AND MANUFACTURING METHOD THEREOF

TECHNICAL FIELD

The present invention relates to a battery structure and a manufacturing method thereof, and more particularly to a thin film battery structure and a manufacturing method thereof.

BACKGROUND

With the increasing reduction in weight, thickness, and size of 3C electronic products, there is an increasing demand for portable energy sources. Defects of conventional colloidal or solid electrolyte thin film batteries, for example, a lithium-ion battery, are that capacitance cannot be improved due to low energy density when current density is high, and charging and discharging are also unstable when current density is high.

Please refer to U.S. Pat. No. 7,540,886 B2 entitled "METHOD OF MANUFACTURING LITHIUM BATTERY". The patent provides a method of manufacturing an all-solid lithium battery. A lithium battery manufactured by using this method is a lithium battery with a layered structure. Because a contact area between a solid active material and a solid electrolyte is insufficient, a part exceeding a thickness of 400 nm of a film of a lithium cobalt oxide (LiCoO2) all-solid thin film battery cannot be fully utilized during charging and discharging when current density is high.

Please refer to Taiwan Patent No. TW200919802 entitled "SOLID-STATE BATTERY AND METHOD FOR MANUFACTURING OF SUCH A SOLID-STATE BATTERY". The patent provides a method for manufacturing a solid battery. However, the battery is a layered stack solid battery, and capacitance of the battery per unit area cannot be improved effectively when current density is high.

Please refer to European Patent No. EP1928051 entitled "THIN FILM LITHIUM BATTERY". The patent provides a patterned electrode material. A battery in the patent is a dislocation solid battery with a layered structure, and an objective is to prevent occurrence of a pinhole effect which results in a short circuit in the lithium-ion thin film battery. Therefore, capacitance of the battery per unit area cannot be improved effectively when current density is high.

Please refer to Japanese Patent No. JP2013080669 entitled "LITHIUM-ION BATTERY". The patent provides a 450 nm silicon thin film as an anode. A battery in the patent has great capacitance, but it is also a solid battery with a layered structure, and therefore capacitance of the battery per unit area still cannot be improved effectively when current density is high.

In view of the foregoing technical background, the present invention provides a thin film battery structure and a manufacturing method thereof. During charging and discharging when current density is high, a battery in the present invention has great capacitance and a long cycle life, and utilization of an electrode including an active material is improved, thereby reducing manufacturing costs of capacitance per unit.

SUMMARY

The present invention provides a thin film battery structure and a manufacturing method thereof. During charging and discharging when current density is high, a battery in the present invention has great capacitance and a long cycle life, and utilization of an electrode including an active material is improved, thereby reducing manufacturing costs of capacitance per unit.

In an embodiment, the present invention provides a thin film battery structure, comprising: a substrate, a first current collector layer, a first electrode layer array, an electrolyte layer, a second electrode layer, and a second current collector layer. The first current collector layer is disposed on the substrate and has at least one first current collector bump. The first electrode layer array has at least one first electrode layer, where each first electrode layer is disposed on the first current collector layer, and at least one first current collector bump is embedded inside each first electrode layer. Each first electrode layer is embedded inside the electrolyte layer. The second electrode layer is disposed on the electrolyte layer. The second current collector layer is disposed on the second electrode layer.

In another embodiment, the present invention provides a manufacturing method of a thin film battery structure, comprising: providing a substrate; forming a first current collector layer on the substrate, where the first current collector layer has at least one first current collector bump; forming at least one first electrode layer array, where each first electrode layer is disposed on the first current collector layer, and at least one first current collector bump is embedded inside each first electrode layer; forming an electrolyte layer on the first current collector layer and each first electrode layer; forming a second electrode layer on the electrolyte layer; and forming a second current collector layer on the second electrode layer.

DETAILED DESCRIPTION OF DISCLOSED EMBODIMENTS

Figure 1:
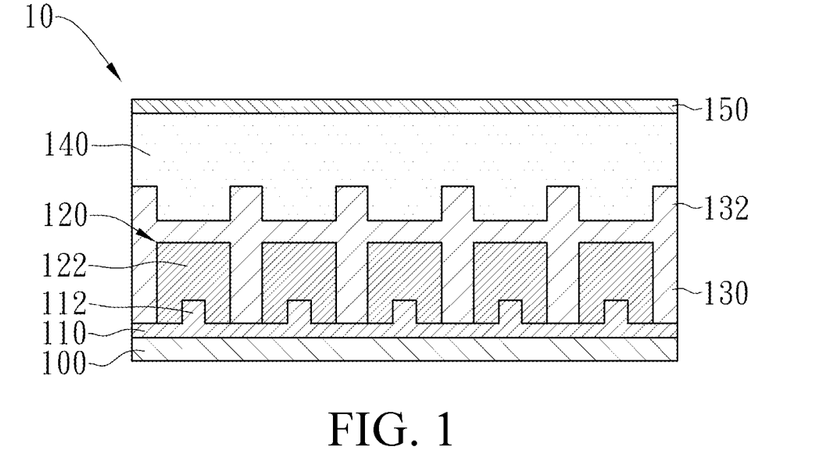
FIG. 1 is a schematic diagram of a thin film battery structure according to a first embodiment of the present invention.

FIG. 1 is a schematic diagram of a thin film battery structure according to a first embodiment of the present invention. The thin film battery structure 10 includes a substrate 100, a first current collector layer 110, a first electrode layer array 120, an electrolyte layer 130, a second electrode layer 140, and a second current collector layer 150. The first current collector layer 110 is disposed on the substrate 100 and has at least one first current collector bump 112. In an embodiment, the first current collector layer 110 and the first current collector bump 112 may be made of two different materials, but the present invention is not limited thereto. The first electrode layer array 120 has at least one first electrode layer 122, where each first electrode layer 122 is disposed on the first current collector layer 110, and at least one first current collector bump 112 is embedded inside each first electrode layer 122. The first electrode layer 122 and the first current collector bump 112 made be made of a same material, but the present invention is not limited thereto. Each first electrode layer 122 is embedded inside the electrolyte layer 130. In this embodiment, the electrolyte layer 130 is further disposed on the first current collector layer 110, but the present invention is not limited thereto. The second electrode layer 140 is disposed on the electrolyte layer 130. The second current collector layer 150 is disposed on the second electrode layer 140.

Figure 2:
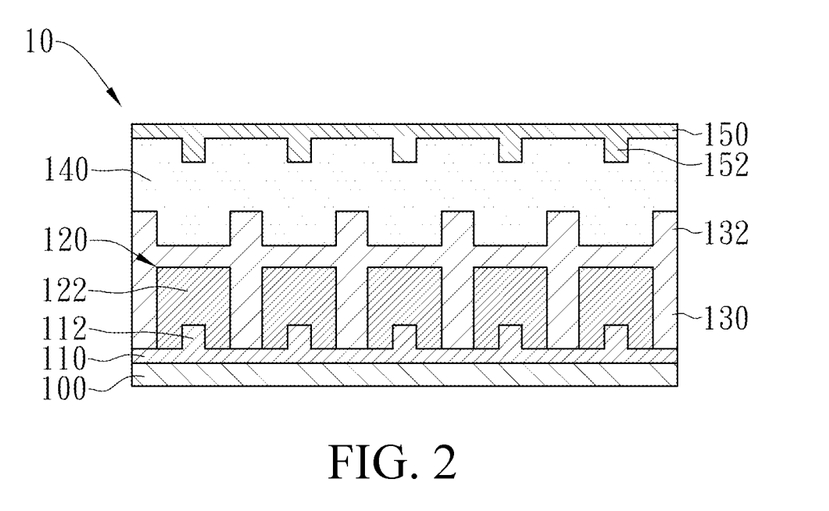
FIG. 2 is a schematic diagram of a thin film battery structure according to a second embodiment of the present invention.

FIG. 2 is a schematic diagram of a thin film battery structure according to a second embodiment of the present invention. The second current collector layer 150 further has at least one second current collector bump 152, and the at least one second current collector bump 152 is embedded inside the second electrode layer 140. In an embodiment, the second current collector layer 150 and the second current collector bump 152 may be made of two different materials, or the second current collector layer 150 and the second current collector bump 152 may be made of a same material, which is not limited in the present invention.

In an embodiment, the substrate 100 may be an insulating substrate, a conductive substrate, a semiconductor substrate, or a flexible substrate. The first electrode layer 120 may be a rectangular electrode layer, a trapezoid electrode layer, a cylindrical electrode layer, a hollow cylindrical bump, an annular electrode layer, an island electrode layer, or another electrode layer in any shape. In this embodiment, the first electrode layer 120 is a rectangular electrode layer, but the present invention is not limited thereto.

In another embodiment, the electrolyte layer 130 further has at least one electrolyte bump 132. The electrolyte bump 132 may be a rectangular electrolyte bump, a trapezoid electrolyte bump, a cylindrical electrolyte bump, an annular electrolyte bump, an island electrolyte bump, or another electrolyte bump in any shape. The electrolyte layer 130 may be a colloidal electrolyte or a solid electrolyte. The first electrode layer 122 or the second electrode layer 140 may be made of $LiMn_2O_4$, $LiCoO_2$, $LiFePO_4$, $LiNiO_2$, C, Si, $SnO_2$, $TiO_2$, $V_2O_5$, or Li, or may be an alloy or a compound thereof. When the first electrode layer 120 is a cathodic electrode layer, the second electrode layer 140 is an anodic electrode layer; conversely, when the first electrode layer 120 is an anodic electrode layer, the second electrode layer 140 is a cathodic electrode layer. In this embodiment, the electrolyte layer 130 is a solid electrolyte, for example, a solid lithium-ion electrolyte, and the first electrode layer 120 is a cathodic electrode layer while the second electrode layer 140 is an anodic electrode layer, but the present invention is not limited thereto.

It should be especially noted herein that the first current collector bump and the second current collector bump are disposed to help increase surface adhesion between the first electrode layer and the first current collector layer and between the second electrode layer and the second current collector layer and improve capability of the first electrode layer and the second electrode layer in collecting an electron current and an electron hole current. By designing electrode layers or electrolyte layers in various shapes and with a protruding structure, contact areas between the electrolyte layer and the first electrode layer and between the electrolyte layer and the second electrode layer are increased, so that ions are conducted in multiple directions, thereby increasing the conduction efficiency of the electrolyte layer. During charging and discharging when current density is high, capacitance of the thin film battery structure can be improved effectively, and energy density of the thin film battery structure is increased.

Figure 3:
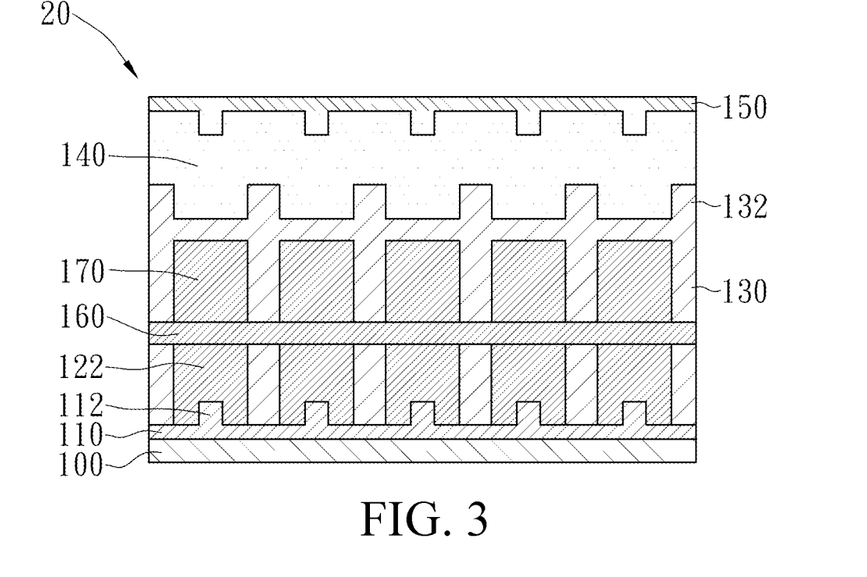
FIG. 3 is a schematic diagram of a thin film battery structure according to a third embodiment of the present invention.

FIG. 3 is a schematic diagram of a thin film battery structure according to a third embodiment of the present invention. The thin film battery structure 20 is basically similar to the thin film battery structure 10 in the first embodiment of the present invention. The thin film battery structure 20 further has a third electrode layer 160 and a fourth electrode layer 170, where the third electrode layer 160 is disposed on the first current collector layer 110, the fourth electrode layer 170 is disposed on the third electrode layer 160, and the first electrode layer 122, the third electrode layer 160, and the fourth electrode layer 170 are embedded inside the electrolyte layer 130 and form a multilayer protruding structure, but the present invention is not limited thereto.

Figure 4:
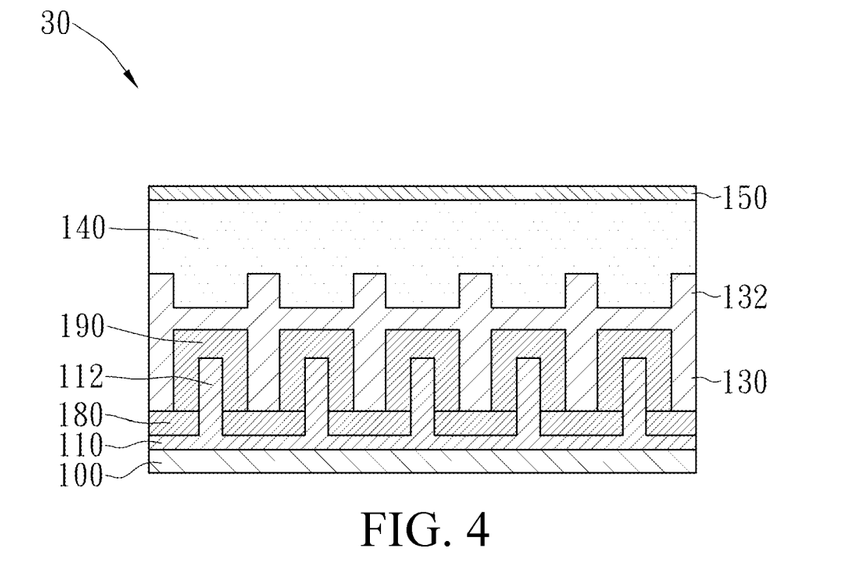
FIG. 4 is a schematic diagram of a thin film battery structure according to a fourth embodiment of the present invention.

FIG. 4 is a schematic diagram of a thin film battery structure according to a fourth embodiment of the present invention. The thin film battery structure 30 is basically similar to the thin film battery structure 10 in the first embodiment of the present invention. The first electrode layer has a fifth electrode layer 180 and a sixth electrode layer 190, where the fifth electrode layer 180 is disposed on the first current collector layer 110, the electrolyte layer 130 and the sixth electrode layer 190 are disposed on the fifth electrode layer 180, and at least one first current collector bump 112 is embedded inside the fifth electrode layer 180 and the sixth electrode layer 190, but the present invention is not limited thereto.

Figure 5:
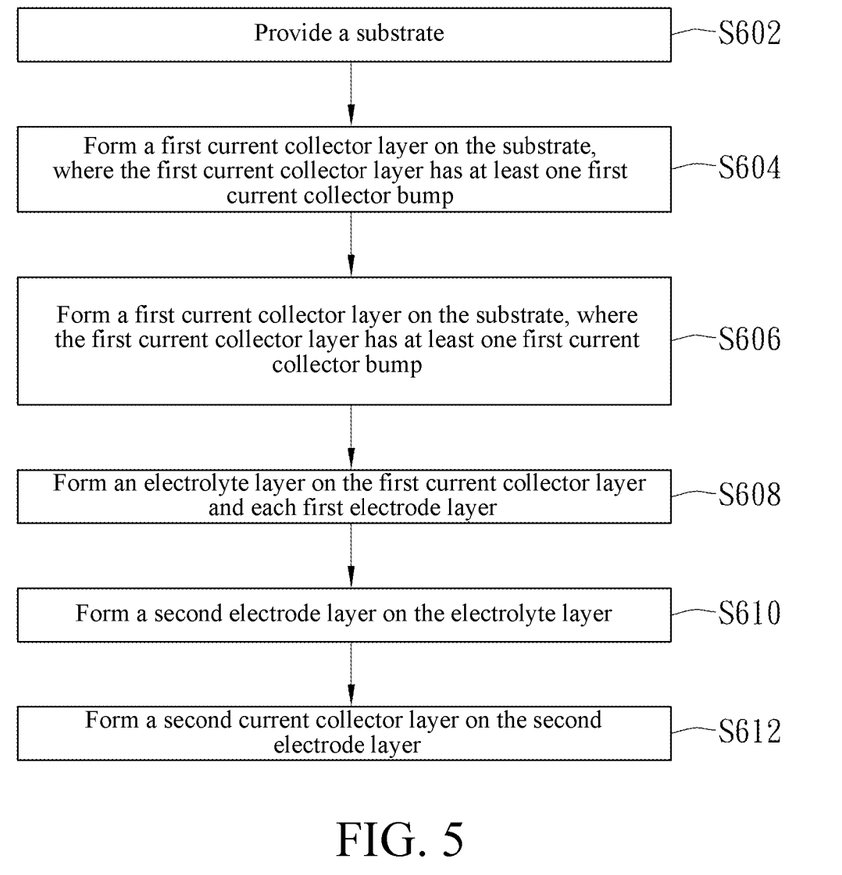
FIG. 5 is a flowchart of a manufacturing method of a thin film battery structure according to the first embodiment of the present invention.

FIG. 5 is a flowchart of a manufacturing method of a thin film battery structure according to the first embodiment of the present invention. FIG. 6A to FIG. 6F are schematic diagrams of manufacture of a thin film battery structure according to the first embodiment of the present invention. The manufacturing method includes the following steps.

Figure 6A:
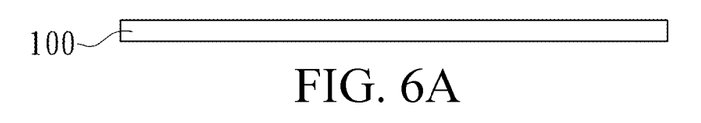
FIG. 6A to FIG. 6F are schematic diagrams of manufacture of a thin film battery structure according to the first embodiment of the present invention.

Step S602: As shown in FIG. 6A, provide a substrate 100. In an embodiment, the substrate 100 may be an insulating substrate, a conductive substrate, a semiconductor substrate, or a flexible substrate, but the present invention is not limited thereto.

Figure 6B:
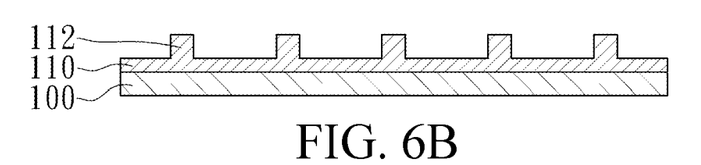

Step S604: As shown in FIG. 6B, form a first current collector layer 110 on the substrate 100, where the first current collector layer 110 has at least one first current collector bump 112. In an embodiment, the first current collector layer 110 may be made of any conductive metal, but the present invention is not limited thereto.

Figure 6C:
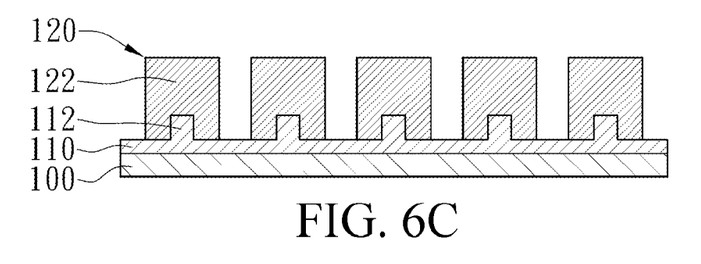

Step S606: As shown in FIG. 6C, form at least one first electrode layer array 120, where each first electrode layer 122 is disposed on the first current collector layer 110, and at least one first current collector bump 112 is embedded inside each first electrode layer 110. In an embodiment, the first electrode layer 120 may be a rectangular electrode layer, a trapezoid electrode layer, a cylindrical electrode layer, a hollow cylindrical electrode layer, an annular electrode layer, an island electrode layer, or another electrode layer in any shape, and the first electrode layer 122 may be made of $LiMn_2O_4$, $LiCoO_2$, $LiFePO_4$, $LiNiO_2$, C, Si, $SnO_2$, $TiO_2$, $V_2O_5$, or Li, or may be an alloy or a compound thereof, but the present invention is not limited thereto. Besides, a shielding process, an etching process, a screen printing process, a nano-imprint process, a photo resistance process, or a laser cutting process may be used in a method for forming the first electrode layer, and vacuum thermal evaporation, radio frequency sputtering, radio frequency magnetron sputtering, high-frequency sputtering, high-frequency magnetron sputtering, chemical vapor deposition, electrostatic spray deposition, or pulsed laser deposition may be performed, so as to form the first electrode layer. In this embodiment, the first electrode layer 120 is a rectangular electrode layer, and the first electrode layer is formed by using a shielding process, but the present invention is not limited thereto.

Figure 6D:
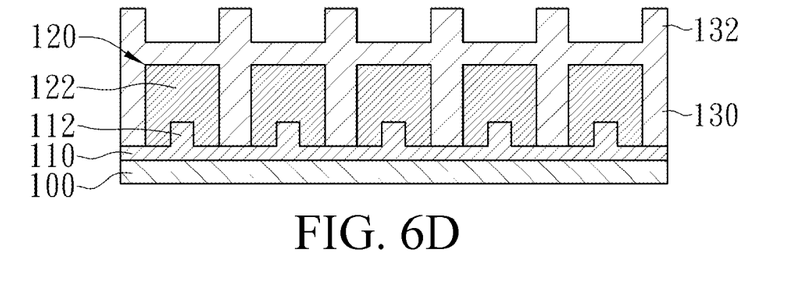

Step S608: As shown in FIG. 6D, form an electrolyte layer 130 on the first current collector layer 110 and each first electrode layer 122. In an embodiment, the electrolyte layer 130 further has at least one electrolyte bump 132. The electrolyte bump 132 may be a rectangular electrolyte bump, a trapezoid electrolyte bump, a cylindrical electrolyte bump, an annular electrolyte bump, an island electrolyte bump, or another electrolyte bump in any shape. The electrolyte layer 130 may be a colloidal electrolyte or a solid electrolyte. In this embodiment, the electrolyte layer 130 further has at least one rectangular electrolyte bump, and the electrolyte layer 130 is a solid electrolyte, for example, a solid lithium-ion electrolyte, but the present invention is not limited thereto.

In this embodiment, the electrolyte layer 130 further has at least one rectangular electrolyte bump, and the electrolyte layer 130 is a solid electrolyte, for example, a solid lithium-ion electrolyte, but the present invention is not limited thereto.

Figure 6E:
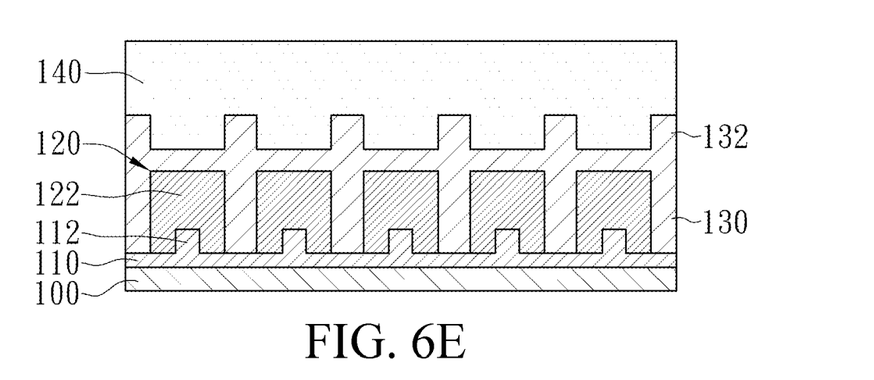

Step S610: As shown in FIG. 6E, form a second electrode layer 140 on the electrolyte layer 130. The second electrode layer 140 may be made of $LiMn_2O_4$, $LiCoO_2$, $LiFePO_4$, $LiNiO_2$, C, Si, $SnO_2$, $TiO_2$, $V_2O_5$, or Li, or may be an alloy or a compound thereof, but the present invention is not limited thereto. When the first electrode layer 120 is a cathodic electrode layer, the second electrode layer 140 is an anodic electrode layer; conversely, when the first electrode layer 120 is an anodic electrode layer, the second electrode layer 140 is a cathodic electrode layer, but the present invention is not limited thereto.

Figure 6F:
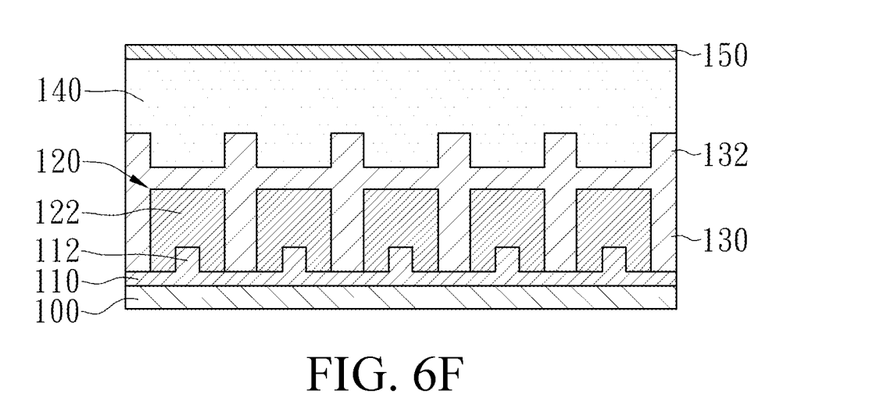

Step S612: As shown in FIG. 6F, form a second current collector layer 150 on the second electrode layer 140.

It should be especially noted herein that manufacturing methods in the second embodiment to the fourth embodiment are all similar to the manufacturing method in the first embodiment, and details are not descried repeatedly herein.

In conclusion, in the thin film battery structure and the manufacturing method thereof in the present invention, the current collector bump with a protruding structure, the electrode layer, and the electrolyte layer are designed to replace a conventional solid battery having a layered structure; the first current collector bump and the second current collector bump in the present invention are disposed to help increase surface adhesion between the first electrode layer and the first current collector layer and between the second electrode layer and the second current collector layer, and improve capability of the first electrode layer and the second electrode layer in collecting an electron current and an electron hole current. By designing electrode layers or electrolyte layers in various shapes and with a protruding structure, contact areas between the electrolyte layer and the first electrode layer and between the electrolyte layer and the second electrode layer are increased, so that ions are conducted in multiple directions, thereby increasing the conduction efficiency of the electrolyte layer. During charging and discharging when current density is high, capacitance of the thin film battery structure is improved effectively, the thin film battery structure has a long cycle life, and utilization of an electrode including an active material is improved, thereby reducing manufacturing costs of capacitance per unit.

The foregoing specific embodiments are merely intended for describing features and functions of the present invention rather than limiting the implementation scope of the present invention, and all equivalent variations and modifications made according to the disclosed content of the present invention without departing from the disclosed spirit and technical field of the present invention shall fall within the scope of the claims.

What is claimed is:

1. A film battery structure, comprising:
   a substrate;
   a first current collector layer, disposed on the substrate and having at least one first current collector bump;
   a first electrode layer array, having at least one first electrode layer, wherein each first electrode layer is disposed on the first current collector layer, and at least one first current collector bump is embedded inside each first electrode layer;
   an electrolyte layer, wherein each first electrode layer is embedded inside the electrolyte layer;
   a second electrode layer, disposed on the electrolyte layer; and
   a second current collector layer, disposed on the second electrode layer.

2. The film battery structure according to claim 1, wherein the electrolyte layer is further disposed on the first current collector layer.

3. The film battery structure according to claim 2, wherein the second current collector layer further has at least one second current collector bump, and the at least one second current collector bump is embedded inside the second electrode layer.

4. The film battery structure according to claim 2, wherein the substrate is an insulating substrate, a conductive substrate, or a semiconductor substrate.

5. The film battery structure according to claim 2, wherein the first electrode layer is a rectangular electrode layer, a trapezoid electrode layer, a cylindrical electrode layer, or an annular electrode layer.

6. The film battery structure according to claim 2, wherein the electrolyte layer further has at least one electrolyte bump.

7. The film battery structure according to claim 6, wherein the electrolyte bump is a rectangular electrolyte bump, a trapezoid electrolyte bump, a cylindrical electrolyte bump, a hollow cylindrical bump, or an annular electrolyte bump.

8. The film battery structure according to claim 2, wherein the electrolyte layer is a colloidal electrolyte or a solid electrolyte.

9. The film battery structure according to claim 2, wherein the first electrode layer or the second electrode layer is made of $LiMn_2O4$, $LiCoO_2$, $LiFePO_4$, $LiNiO_2$, C, Si, $SnO_2$, $TiO_2$, $V_2O_5$, or Li, is an alloy thereof or a compound thereof.

10. The film battery structure according to claim 2, wherein when the first electrode layer is a cathodic electrode layer, the second electrode layer is an anodic electrode layer.

11. The film battery structure according to claim 2, wherein when the first electrode layer is an anodic electrode layer, the second electrode layer is a cathodic electrode layer.

12. The film battery structure according to claim 2, wherein the thin film battery structure further has a third electrode layer and a fourth electrode layer, wherein the third electrode layer is disposed on the first current collector layer, the fourth electrode layer is disposed on the third electrode layer, and the first electrode layer, the third electrode layer, and the fourth electrode layer are embedded inside the electrolyte layer.

13. The film battery structure according to claim 12, wherein the thin film battery structure has a fifth electrode layer and a sixth electrode layer, wherein the fifth electrode layer is disposed on the first current collector layer, the electrolyte layer and the sixth electrode layer are disposed on the fifth electrode layer, and at least one first current collector bump is embedded inside the fifth electrode layer and the sixth electrode layer.

14. A manufacturing method of a film battery structure, comprising the following steps:
    providing a substrate;
    forming a first current collector layer on the substrate, wherein the first current collector layer has at least one first current collector bump;
    forming at least one first electrode layer array, wherein each first electrode layer is disposed on the first current collector layer, and at least one first current collector bump is embedded inside each first electrode layer;
    forming an electrolyte layer on the first current collector layer and each first electrode layer;
    forming a second electrode layer on the electrolyte layer; and
    forming a second current collector layer on the second electrode layer.

15. The manufacturing method according to claim 14, wherein the second current collector layer further has at least one second current collector bump, and the at least one second current collector bump is embedded inside the second electrode layer.

16. The manufacturing method according to claim 14, wherein the substrate is an insulating substrate, a conductive substrate, or a semiconductor substrate.

17. The manufacturing method according to claim 14, wherein the first electrode layer is a rectangular electrode layer, a trapezoid electrode layer, a cylindrical electrode layer, or an annular electrode layer.

18. The manufacturing method according to claim 14, wherein a method of forming the first electrode layer is a shielding process, an etching process, a screen printing process, a nano-imprint process, a photo resistance process, or a laser cutting process.

19. The manufacturing method according to claim 18, wherein the method of forming the first electrode layer is vacuum thermal evaporation, radio frequency sputtering, radio frequency magnetron sputtering, high-frequency sputtering, high-frequency magnetron sputtering, chemical vapor deposition, electrostatic spray deposition, or pulsed laser deposition.

* * * * *